(12) United States Patent
Salter et al.

(10) Patent No.: US 10,077,576 B1
(45) Date of Patent: Sep. 18, 2018

(54) VEHICLE KEYPAD ILLUMINATION ASSEMBLY AND METHOD

(71) Applicant: Ford Global Technologies, LLC, Dearborn, MI (US)

(72) Inventors: Stuart C. Salter, White Lake, MI (US); Paul Kenneth Dellock, Northville, MI (US); James J. Surman, Clinton Township, MI (US); Cornel Lewis Gardner, Romulus, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 0 days.

(21) Appl. No.: 15/782,124

(22) Filed: Oct. 12, 2017

(51) Int. Cl.
| E05B 17/10 | (2006.01) |
| G07C 9/00 | (2006.01) |
| B60R 25/23 | (2013.01) |
| H03K 17/96 | (2006.01) |

(52) U.S. Cl.
CPC .............. *E05B 17/10* (2013.01); *B60R 25/23* (2013.01); *G07C 9/0069* (2013.01); *G07C 9/00714* (2013.01); *H03K 17/9622* (2013.01)

(58) Field of Classification Search
CPC ...................................................... E05B 17/10
See application file for complete search history.

(56) References Cited

U.S. PATENT DOCUMENTS

| 7,221,359 | B2 | 5/2007 | Hein et al. |
| 7,255,466 | B2 | 8/2007 | Schmidt et al. |
| 7,637,631 | B2 | 12/2009 | McDermott et al. |
| 8,994,495 | B2 | 3/2015 | Dassanayake et al. |
| 9,499,127 | B2 | 11/2016 | Pribisic et al. |
| 2003/0040871 | A1* | 2/2003 | Siegel ..................... B23P 19/06 702/33 |
| 2007/0205088 | A1* | 9/2007 | Lee ......................... H01H 13/83 200/314 |
| 2008/0166506 | A1* | 7/2008 | Shin ........................ H04M 1/22 428/29 |
| 2012/0327441 | A1* | 12/2012 | Adachi ................. G06F 3/1205 358/1.13 |
| 2014/0000165 | A1* | 1/2014 | Patel ...................... E05B 81/76 49/31 |
| 2016/0364558 | A1* | 12/2016 | Rome .................... G06F 21/316 |
| 2017/0018129 | A1 | 1/2017 | Huebner |
| 2017/0131898 | A1* | 5/2017 | Markiewicz ........ G06F 3/04886 |
| 2018/0080614 | A9* | 3/2018 | Aanegola .................. F21K 9/64 |

OTHER PUBLICATIONS

Unknown, Boyo A-Pass Touch Keyless Vehicle Digital Touch Keypad, Internet page.

* cited by examiner

*Primary Examiner* — Laura Nguyen
(74) *Attorney, Agent, or Firm* — Carlson, Gaskey & Olds, P.C.

(57) ABSTRACT

An exemplary vehicle keypad assembly includes, among other things a virtual button having a first area and a second area, a first phosphor between the first area and a light source, and a different, second phosphor between the second area and the light source. An exemplary vehicle keypad illumination method includes, among other things, selectively illuminating a first area of a keypad in one of a plurality of different colors while illuminating a different, second area of the keypad in a single color.

20 Claims, 5 Drawing Sheets

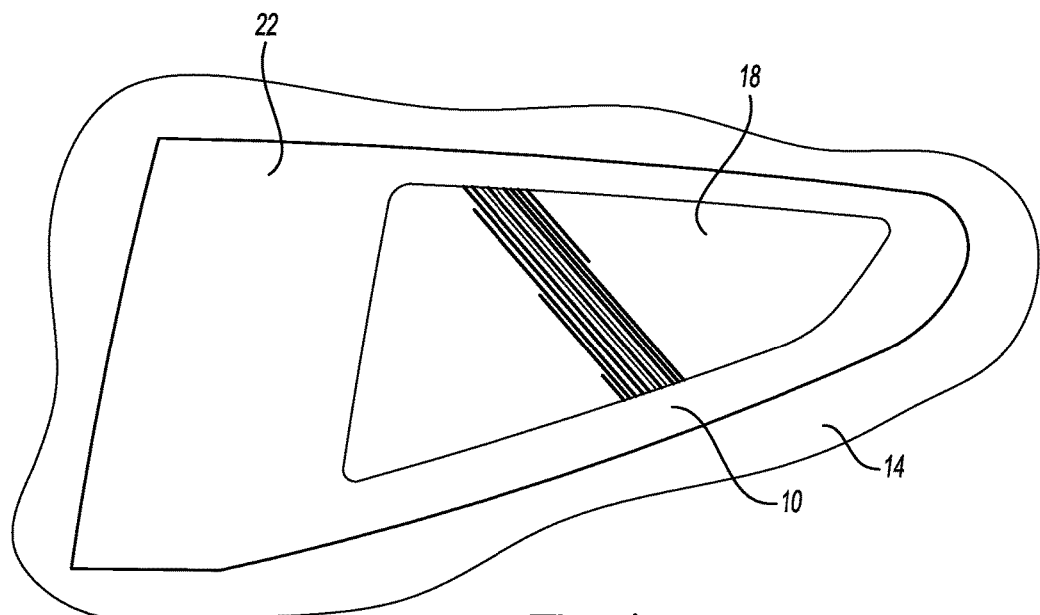
_Fig-1_
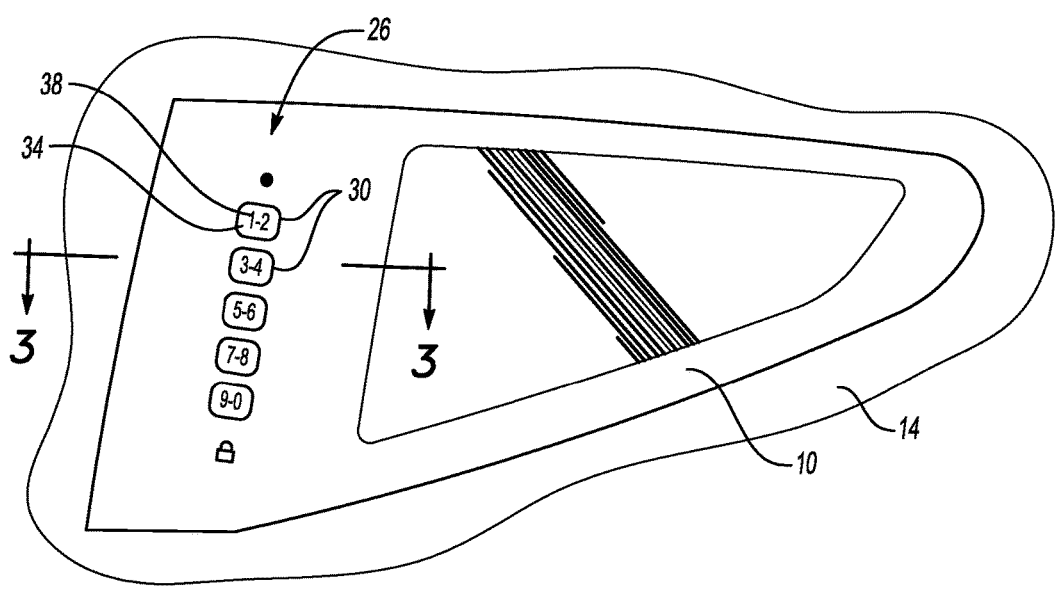
_Fig-2_

VEHICLE KEYPAD ILLUMINATION ASSEMBLY AND METHOD

TECHNICAL FIELD

This disclosure relates generally to a keypad of a vehicle, and, more particularly, to illuminating areas of the keypad in different colors.

BACKGROUND

Many vehicles incorporate keypad systems. Some keypad systems include a touch-sensitive keypad located on an exterior area of the vehicle near, for example, a B-pillar or a window of the vehicle.

Doors of the vehicle can lock or unlock in response to a user utilizing the keypad to input an appropriate code. Other functions of the vehicle can also be controlled through the keypad, such as, for example, locking or unlocking a trunk compartment. The keypad system can permit control of such functions from outside the vehicle, and without requiring the user to manipulate a physical latch on the door or interface directly with a key fob.

The keypads of some keypad systems are disposed adjacent transparent panels of the vehicle, such as adjacent a rear side glass panel of the vehicle. The keypads can include virtual buttons associated with, for example, capacitance-type sensing devices. The virtual buttons each correspond to a designated region of the transparent panel. A user can contact one or more of the designated regions to activate one or more of the virtual buttons.

SUMMARY

A vehicle keypad assembly according to an exemplary aspect of the present disclosure includes, among other things a virtual button having a first area and a second area. A first phosphor is between the first area and a light source. A different, second phosphor is between the second area and the light source.

In a further non-limiting embodiment of the foregoing assembly, the light source includes an ultraviolet light source and a visible light source.

In a further non-limiting embodiment of any of the foregoing assemblies, the ultraviolet light source is an ultraviolet-light Light-Emitting Diode, and the visible light source is a visible-light Light-Emitting Diode.

A further non-limiting embodiment of any of the foregoing assemblies includes a keypad controller configured to selectively activate the ultraviolet light source, the visible light source, or both to illuminate the first area in a first color, a second color, or a third color.

In a further non-limiting embodiment of any of the foregoing assemblies, the second area is illuminated in the first color when the ultraviolet light source is activated, when the visible light source is activated, and when both the ultraviolet light source and the visible light source are activated. The second area is illuminated in the first color when the first area is illuminated in the first color, the second color, or the third color.

In a further non-limiting embodiment of any of the foregoing assemblies, the first area corresponds to a background area of the virtual button, and the second area corresponds to an image disposed within the background.

In a further non-limiting embodiment of any of the foregoing assemblies, the image is an alphanumeric character.

In a further non-limiting embodiment of any of the foregoing assemblies, the first phosphor emit lights light in a first color, and the second phosphor emits light in a different, second color.

In a further non-limiting embodiment of any of the foregoing assemblies, the first color is green and the second color is red.

In a further non-limiting embodiment of any of the foregoing assemblies, the virtual button is associated with a capacitance-type sensing device.

A further non-limiting embodiment of any of the foregoing assemblies includes a transparent panel of a vehicle. The transparent panel includes the virtual button. The first phosphor and the second phosphor are disposed on an interior of the transparent panel such that at least some light emitted from the first phosphor, the second phosphor, and the light source passes through the transparent panel and is visible from an exterior of the vehicle.

A further non-limiting embodiment of any of the foregoing assemblies includes a coating applied to an interior surface of the panel between the first phosphor and the interior surface, but not between the second phosphor and the interior surface.

In a further non-limiting embodiment of any of the foregoing assemblies, the first phosphor is an array of dots applied to the coating, and the second phosphor is an array of dots applied to the interior surface of the panel.

In a further non-limiting embodiment of any of the foregoing assemblies, the transparent panel is a glass panel.

A vehicle keypad illumination method according to another exemplary aspect of the present disclosure includes, among other things, selectively illuminating a first area of a keypad in one of a plurality of different colors while illuminating a different, second area of the keypad in a single color.

In a further non-limiting embodiment of the foregoing method, the first area and the second area are areas of a virtual button of the keypad, and the method includes illuminating the second area in a first color and the first area in a second color to indicate an unsuccessful activation of the virtual button. The method further includes illuminating the second area in the first color and the first area in a third color to indicate a successful activation of the virtual button.

A further non-limiting embodiment of any of the foregoing methods includes activating a visible light source to illuminate the first and second areas in a first color. The method further includes activating an ultraviolet light source to excite a first phosphor that illuminates the first area in a second color, and to excite a second phosphor that illuminates the second area in the first color. The method further includes activating both the visible light source and the ultraviolet light source to illuminate the first area in a third color, and to illuminate the second area in the first color.

In a further non-limiting embodiment of any of the foregoing methods, the keypad is associated with a capacitance-type sensing device having a plurality of virtual buttons disposed within a transparent panel of a vehicle.

A further non-limiting embodiment of any of the foregoing methods, includes illuminating selected ones of the plurality of virtual buttons to remind a user of a feature that can be initiated by activating the selected ones of the plurality of virtual buttons.

A further non-limiting embodiment of any of the foregoing methods includes changing an intensity of the illuminating of the second area in the single color when changing the illuminating of the first area from a first one of the plurality of colors to a second one of the plurality of colors.

BRIEF DESCRIPTION OF THE FIGURES

The various features and advantages of the disclosed examples will become apparent to those skilled in the art from the detailed description. The figures that accompany the detailed description can be briefly described as follows:

FIG. 1 illustrates a rear side glass panel area of a vehicle.

FIG. 2 illustrates a keypad having a plurality of virtual buttons illuminated on the rear side glass panel.

Figure 3:
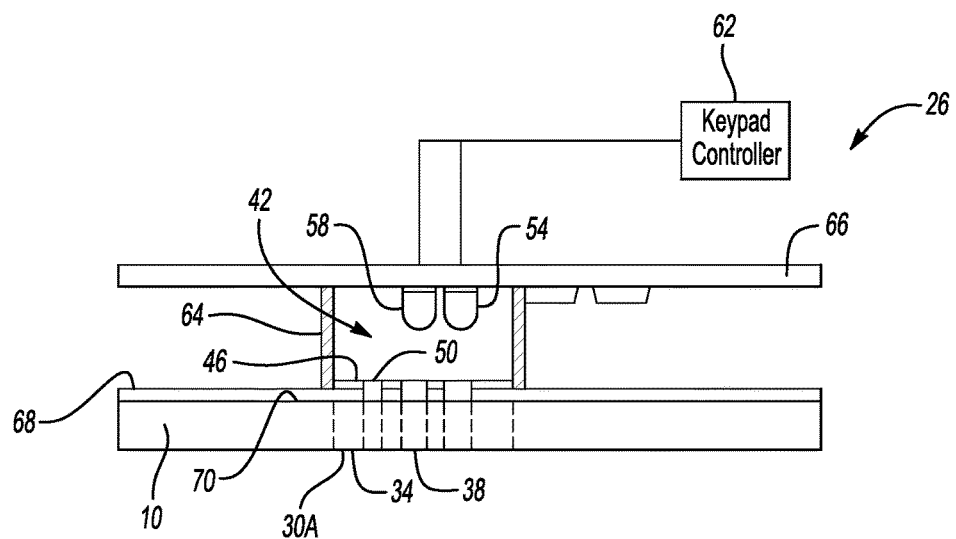
FIG. 3 illustrates a section view taken along line 3-3 in FIG. 2.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

This disclosure relates generally to a keypad for a vehicle. In particular, the keypad can be a touch-sensitive keypad including a plurality of virtual buttons. By utilizing different types of phosphors, the virtual buttons can be illuminated in different color combinations and intensities to provide useful feedback to a user.

FIG. 1 shows a driver side rear side window 10 of an exemplary vehicle 14. The window includes a relatively transparent region 18 and a relatively opaque region 22. The window 10 is a clear glass in the exemplary embodiment. The opaque region 22 is established by applying a coating, such as a blackout coating, to an inwardly facing surface of the window 10.

Referring now to FIG. 2, a keypad assembly 26 of a keypad system for the vehicle 14 includes a plurality of virtual buttons 30 within the opaque region 22 of the window 10. The virtual buttons 30, and other portions of the keypad assembly 26, are illuminated. The illumination is in response to a user contacting the window 10 in an area of the keypad assembly 26.

The plurality of virtual buttons 30 are in designated regions of the window 10. The designated regions are touch-sensitive. One of the virtual buttons 30 of the keypad assembly 26 can be activated by a user touching a designated region of the window 10 corresponding to that virtual button 30.

A person having skill in this art and the benefit of this disclosure would understand how to configure the window 10 such that the designated regions of the window 10 are touch-sensitive.

In some examples, capacitive sensors (not shown) are used to sense a user's fingers contacting the window 10 in one or more of the designated regions. Other options could include optical switches that emit light through the designated region. A user's contact with the designated region can then be detected by a sensor that detects light reflected by the user's finger, for example.

Notably, the virtual buttons 30 each include a first area 34 corresponding generally to a background area of the virtual button and a second area 38 corresponding generally to an image disposed within the first area 34 (i.e. background). The image is an alphanumeric character in this example.

FIG. 2 shows the keypad assembly 26 after waking in response to a user's interaction with an area of the window 10 near the keypad assembly 26. The intensity of the illumination associated with the first area 34 is less than an intensity of the illumination associated with the second area 38. Thus, in the exemplary embodiment, the image stands out from the first area 34. The first area 34 and the second area 38 are, however, illuminated in the same color, which is red in this example.

Referring now to FIG. 3, the vehicle keypad assembly 26 includes a virtual button 30A having the first area 34, and the second area 38. The virtual button 30A corresponds to numerals 3-4 of the keypad assembly 26.

The vehicle keypad assembly 26 further includes a light source 42, a first phosphor 46, and a second phosphor 50. The first phosphor 46 is between the first area 34 of the virtual button 30 and the light source 42. The second phosphor 50 is between the second areas 38 of the virtual button 30 and the light source 42.

The light source 42 in this exemplary non-limiting embodiment includes a plurality of Light-Emitting diodes ("LEDs"). In particular, the light source 42 includes a visible-light LED 54, such as a red LED, and an ultraviolet-light LED 58. Although the single visible-light LED 54 and the single ultraviolet-light LED 58 are shown, other exemplary embodiments could incorporate more than one visible-light LED 54 and more than one ultraviolet-light LED 58. The vehicle keypad assembly 26 further includes a keypad controller 62.

A housing 64 extends from a circuit board 66 to a blackout coating 68 along an interior surface 70 of the window 10. The housing 64 confines light from the light source 42, the first phosphor 46, and the second phosphor 50 to the region of the virtual button 30.

The first phosphor 46 is, in this exemplary embodiment, a glow-green phosphor. When the first phosphor 46 is activated, the first phosphor 46 emits a green light. The first phosphor 46 is applied to the blackout coating 68 along the interior surface 70 of the window 10.

The second phosphor 50 is a glow-red phosphor. That is, the second phosphor 50 illuminates a red light when activated. The second phosphor 50 is secured directly adjacent the interior surface 70 of the window 10 and extends through the blackout coating 68.

The first phosphor 46 and the second phosphor 50 are activated in response to UV light emitted from the ultraviolet-light LED 58. Light from the visible-light LED 54 does not activate the first phosphor 46 and the second phosphor 50 in this example.

The remaining virtual buttons 30 of the keypad assembly 26 are configured similarly to the virtual button 30A. That is, the remaining virtual buttons 30 include respective light sources, first phosphors, and second phosphors.

The example keypad controller 62 can include a processor operatively linked to a memory portion. The example processor can be programmed to execute a program stored in the memory portion. The program may be stored in the memory portion as software code.

The program stored in the memory portion may include one or more additional or separate programs, each of which includes an ordered listing of executable instructions for implementing logical functions. The instructions enable the keypad controller 62 to activate the light source 42 such that the light source 42 emits light. The activation of the light source 42 could be in response to a command from a signal indicating that a user as contacted areas of, or near, the keypad assembly 26. The keypad controller 62 can selectively actuate the visible-light LED 54, the ultraviolet-light LED 58, or both to, together with the first phosphor 46 and the second phosphor 50, illuminate the virtual button 30A in a variety of colors.

To illuminate the virtual button 30A to have the illumination pattern shown in FIG. 2, the visible-light LED 54 is turned on by the keypad controller 62, and the ultraviolet-light LED 58 is turned off by the keypad controller 62. The activation of the visible-light LED 54 can be in response to a user initially contacting the virtual button 30A or another area of the keypad assembly 26.

When activated, light from the visible-light LED 54 emanates through the first phosphor 46 to illuminate the first areas of the virtual button 30A, and through the second phosphor 50 to illuminate the second areas 38 of the virtual button 30A. The first phosphor 46 and the second phosphor 50 can act as a diffuser for the light from the visible-light LED 54.

Figure 4:
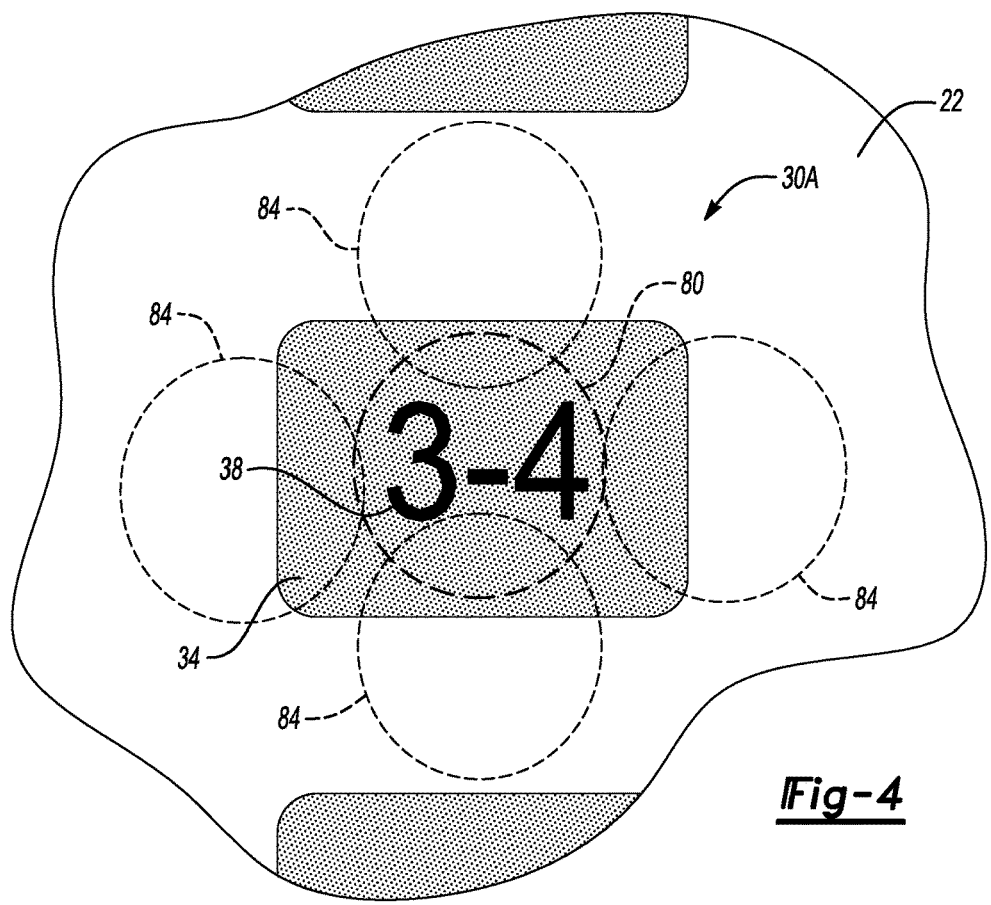
FIG. 4 illustrates a close-up of a virtual button from the keypad of FIG. 2 with an exemplary activation region and several exemplary misactivation regions.

Referring now to FIG. 4, the virtual button 30A has an area 80 represented by broken lines that, when fully contacted, will result in activation of the virtual button 30A. That is, if the virtual button 30A is capacitance based, the keypad controller 62 recognizes the capacitance change caused by a user's finger contacting the area 80 as sufficient to activate the virtual button 30A.

Other areas 84 represented by broken lines, if contacted by a user's finger, will not cause the keypad controller 62 to activate the virtual button 30A. That is, a user's finger contacting the areas 84 will not cause the capacitance change required by the keypad controller 62 to activate the virtual button 30A.

Figure 5:
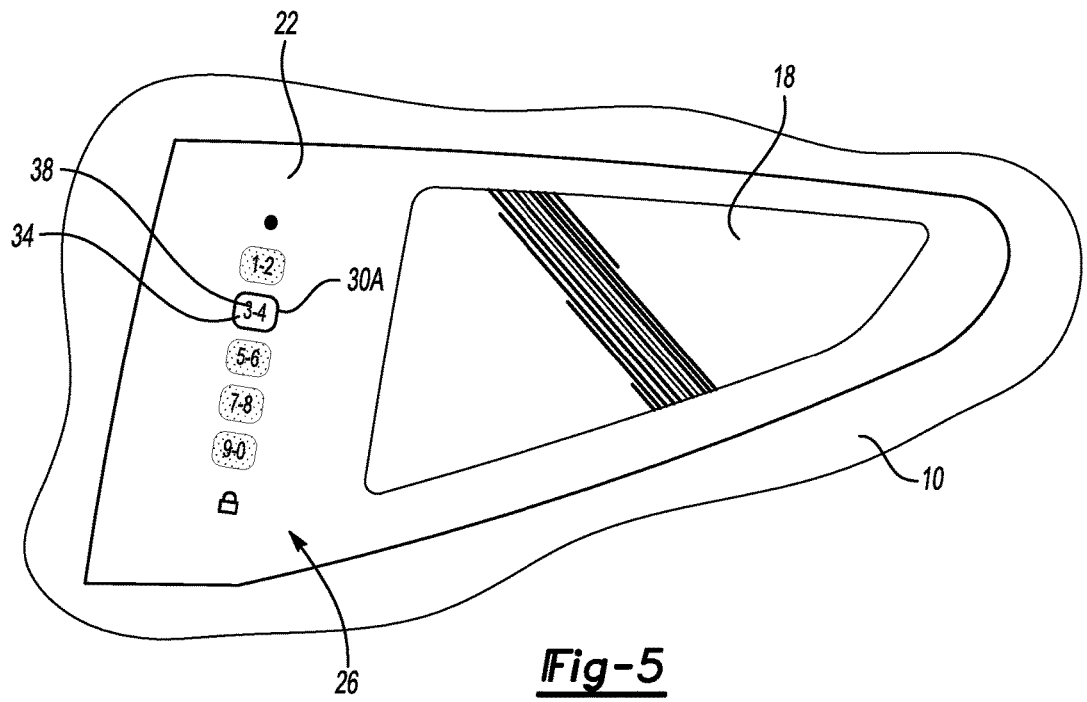
FIG. 5 illustrates the keypad and glass panel of FIG. 2 after a user has successfully activated one of the virtual buttons.

After the user taps the area 80 of virtual button 30A, the virtual button 30A can be illuminated as shown in FIG. 5 to indicate that the user has successfully activated the virtual button 30A. When the activation is successfully, the first area 34, or background, of the virtual button 30 appears green and the second area 38 appears red. To produce this color combination, the keypad controller 62 turns the ultraviolet-light LED 58, while the visible-light LED 54 is turned off.

The first phosphor 46 and the second phosphor 50 are activated by ultraviolet-light emanating from the ultraviolet-light LED 58. The first phosphor 46 then glows green, and the second phosphor 50 then glows red. Since the first phosphor 46 corresponds to the first area 34 of the virtual button 30A, the first area 34 is illuminated in a green color. Since the second phosphor 50 corresponds to the second area 38 of the virtual button 30A, the second area 38, here the numbers "3-4" are illuminated in a red color. The first area 34 being green indicates that the user's tap of the virtual button 30A successfully activated the virtual button 30A.

Figure 6:
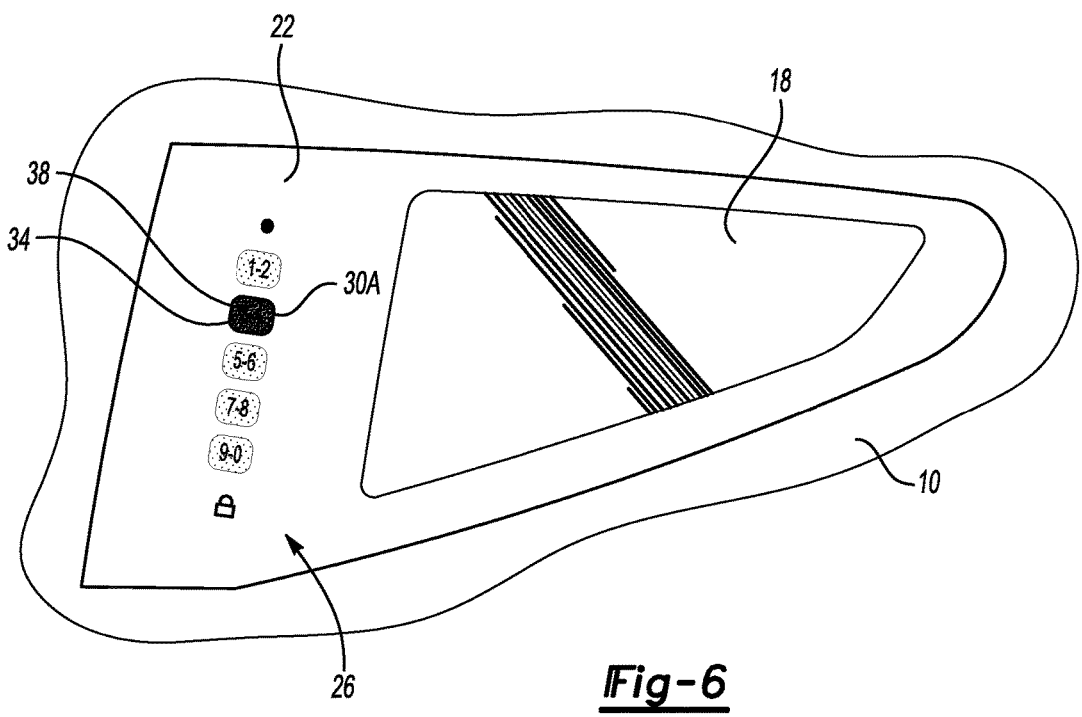
FIG. 6 illustrates the keypad of FIG. 2 after a user has unsuccessfully activated one of the virtual buttons.

Should the user tap the virtual button 30A in one of the areas 84, the virtual button 30A can be illuminated as shown in FIG. 6 to indicate that the user's finger tap has missed the virtual button 30A and unsuccessfully activated the virtual button 30A. In the example of FIG. 6, the user may, for example, have attempted to tap the virtual button 30A, but had their finger misaligned with the virtual button 30A such that a capacitance change due to the tapping is insufficient to activate the virtual button 30A.

In such an example, the keypad controller 62 turns on both the visible-light LED 54 and the ultraviolet-light LED 58. The visible red light from the visible-light LED 54 then mixes with the green light emitted from the first phosphor 46 such that the user views the first area 34 as having a yellow color. The visible light from the visible-light LED 54 mixes with the red light from the second phosphor 50 such that the second area 38 of the virtual button 30A retains a red color. The first area 34 being yellow indicates that the user's tap of the virtual button 30A unsuccessfully activated the virtual button 30A.

Rather than turning on the visible-light LED 54, another visible-light LED could instead be turned on to provide visible-light LED 54 along with the ultraviolet-light from the ultraviolet-light LED 58.

Figure 7:
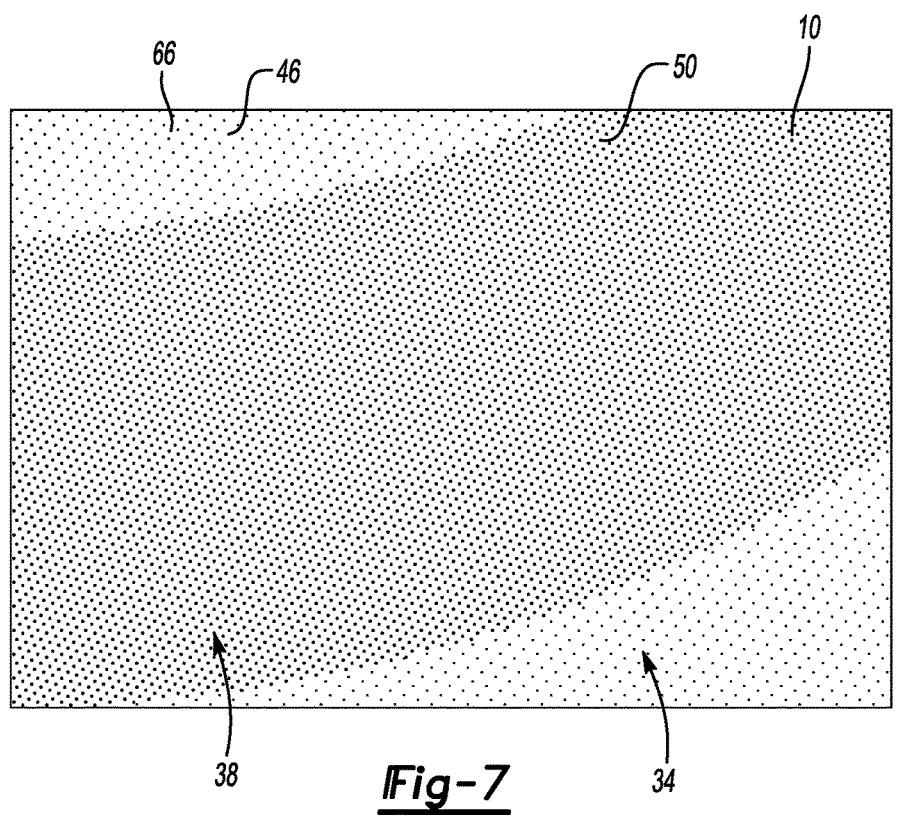
FIG. 7 illustrates a close-up view of a first phosphor and a second phosphor utilized within the keypad assembly of FIG. 2.

Referring now to FIG. 7 with reference to FIG. 4, the first phosphor 46 can be a pattern of painted phosphor dots applied to the blackout coating 68. The second phosphor 50 can be a pattern of dots applied to the interior surface 70 of the window 10. When the visible-light LED 54 is turned on, the ultraviolet-light LED 58 is off, and the first phosphor 46 and second phosphor 50 are not activated, the phosphor dots act as a diffuser permitting some of the visible light to shine through and illuminated the virtual button 30A.

In other examples, the first phosphor 46 and the second phosphor 50 can be printed as a layer on the blackout coating 68 and the interior surface 70 of the window 10. In such an example, a thickness of the printed layer can be controlled to discourage inconsistent thicknesses, which could lead to variations in the intensity of light emitted through the virtual button 30A.

The keypad controller 62 can activate the virtual buttons 30 of the keypad assembly 26 in various colors and patterns to provide useful information to a user of the vehicle 14, such as reminders of the functionality of the keypad assembly 26.

Figure 8:
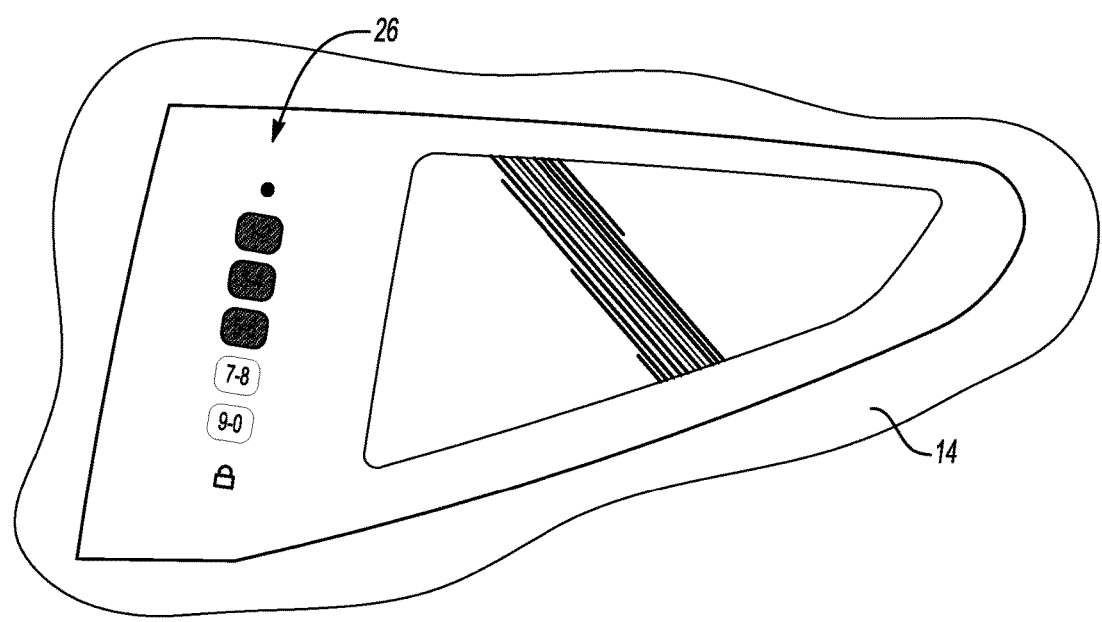
FIG. 8 illustrates an illumination pattern for virtual buttons of the keypad after unlocking all the vehicle doors.

For example, as shown in FIG. 8, the keypad controller 62 may flash virtual buttons 30 having the numbers 1-2, 3-4, and 5-6 in response to a user unlocking the doors of the vehicle 14 via a switch on a door of the vehicle, a key fob, or by some other means other than through the keypad assembly 26. The flashing of these selected virtual buttons 30 in FIG. 8 can, if viewed by the user, alert the user that the user could, instead, have interacted with the keypad assembly 26 to unlock the doors rather than the other device.

The keypad controller 62 (FIG. 3), in such an example, is programmed to unlock the doors of the vehicle 14 if the user taps and activates the virtual buttons 30 having the numbers 1-2, 3-4, and 5-6. The flashing could be in the sequence that the virtual buttons 30 having the numbers 1-2, 3-4, and 5-6 are required to be activated to cause the keypad controller 62 to unlock the doors. For example, the virtual button 30 having the number 1-2 could be flashed, the virtual button 30 having the number 3-4 flashed, and then the virtual button 30 having the number 5-6.

The virtual buttons 30 can be flashed such that the virtual buttons 30 have a red background for a set time, say five seconds. Should a user press the appropriate virtual buttons within the set time, the keypad controller 62 can command the doors of the vehicle 14 to unlock.

If the vehicle 14 has rear child locks, the all unlock function can be applied only to the front doors, or only to the rear doors.

Figure 9:
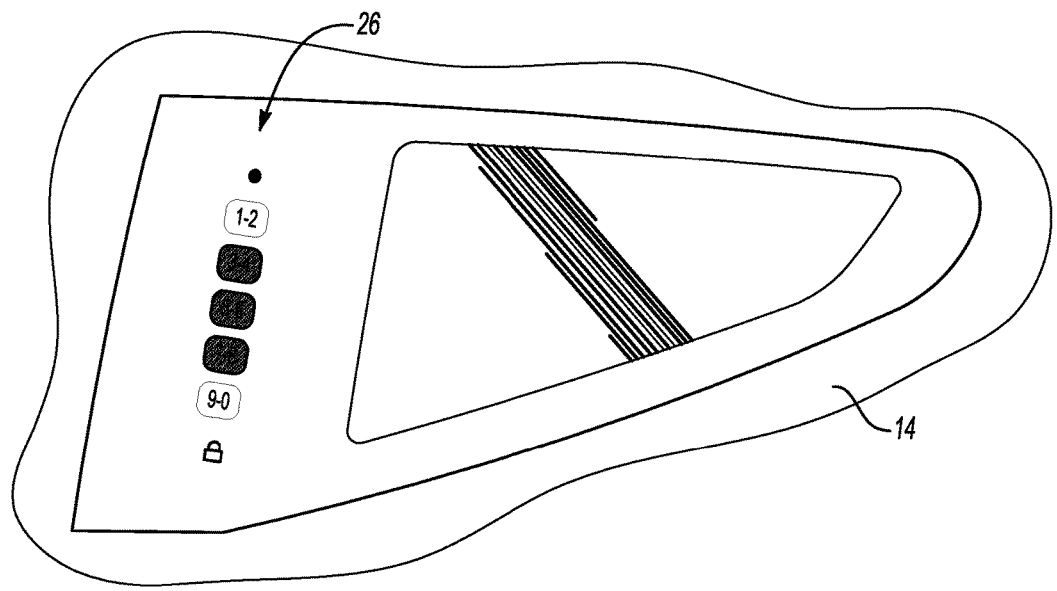
FIG. 9 illustrates an illumination pattern for virtual buttons of the keypad after locking all the vehicle doors.

In FIG. 9, the keypad assembly 26 is shown with the virtual buttons 3-4, 5-6, and 7-8 flashing in response to a user locking all the doors of the vehicle 14 without the user interacting with the keypad assembly 26. This provides a reminder to the user that the user could have interacted with the keypad assembly 26 to lock all the doors rather than by utilizing the other device.

The keypad controller 62, in such an example, is programmed to lock the doors of the vehicle 14 if the user taps and activates the virtual buttons 30 having the numbers 3-4, 5-6, and 7-8. The flashing could be in the sequence that the virtual buttons 30 having the numbers 3-4, 5-6, and 7-8 are required to be activated to cause the keypad controller 62 to unlock the doors. The flashing could be for a set time, and a user activating the virtual buttons 30 within the set time could cause the keypad controller 62 to command the doors of the vehicle 14 to lock.

Figure 10:
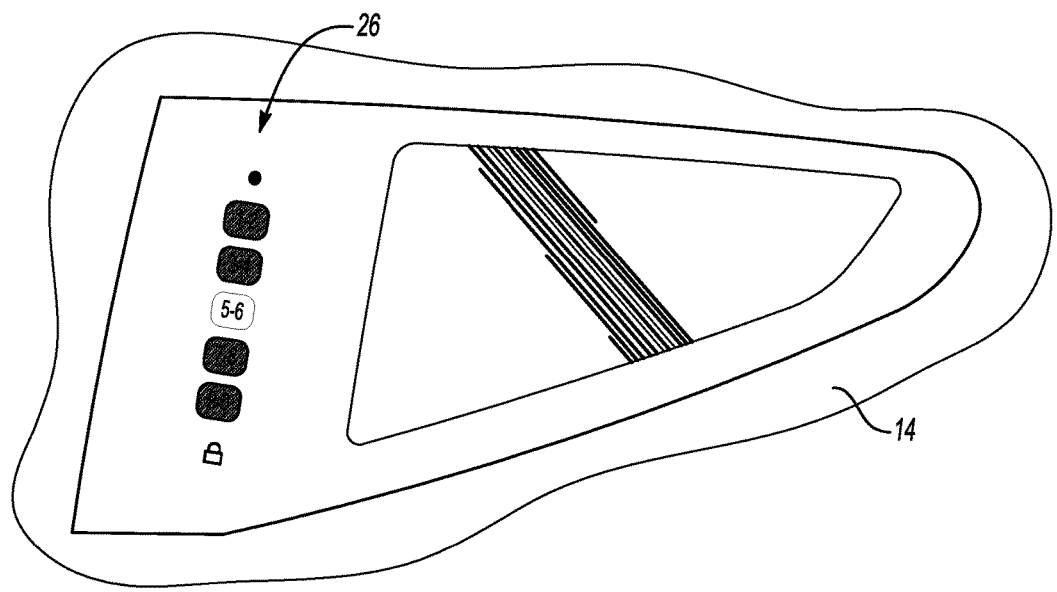
FIG. 10 illustrates an illumination pattern for the keypad after locking or unlocking a trunk compartment of the vehicle.

Referring to FIG. 10, the keypad controller 62 flashes the virtual buttons 1-2, 3-4, 7-3, and 9-0 in response to a user unlocking the trunk, this indicates to the user that the user could have pressed the virtual button 5-6 to unlock the trunk, rather than using a device other than the keypad assembly 26. The keypad controller 62, in such an example, is programmed unlock the trunk of the vehicle 14 if the user taps and activates the virtual buttons 30 having the numbers 1-2, 3-4, 7-3, and 9-0.

The flashing could be for a set time, and a user activating the virtual buttons 30 within the set time could cause the keypad controller 62 to command the trunk of the vehicle 14 to unlock.

Other features that could be utilized incorporating the keypad controller 62 in the associated system include activating the keypad assembly 26 when an ignition from the vehicle is turned off and a door to the vehicle 14 is opened. This feature could remind a user that the keypad assembly 26 is a feature of the vehicle 14.

Features of the disclosed examples include a keypad assembly having virtual buttons that can be activated in a variety of colors and patterns to provide useful feedback to a user. Features include flashing or blinking reminders of virtual buttons that can be used to activate particular functions of the vehicle, and color combinations that indicate a successful activation of the virtual buttons.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. A vehicle keypad assembly, comprising:
   a transparent panel of a vehicle;
   a virtual button within the transparent panel, the virtual button having a first area and a second area;
   a first phosphor between the first area and a light source; and
   a different, second phosphor between the second area and the light source.

2. The vehicle keypad assembly of claim 1, wherein the light source comprises an ultraviolet light source and a visible light source.

3. The vehicle keypad assembly of claim 2, wherein the ultraviolet light source is an ultraviolet-light Light-Emitting Diode, and the visible light source is a visible-light Light-Emitting Diode.

4. The vehicle keypad assembly of claim 2, further comprising a keypad controller configured to selectively activate the ultraviolet light source, the visible light source, or both to illuminate the first area in a first color, a second color, or a third color.

5. The vehicle keypad assembly of claim 4, wherein the second area is illuminated in the first color when the ultraviolet light source is activated, when the visible light source is activated, and when both the ultraviolet light source and the visible light source are activated, such that second area is illuminated in the first color when the first area is illuminated in the first color, the second color, or the third color.

6. The vehicle keypad assembly of claim 1, wherein the first area corresponds to a background area of the virtual button, and the second area corresponds to an image disposed within the background.

7. The vehicle keypad assembly of claim 6, wherein the image is an alphanumeric character.

8. The vehicle keypad assembly of claim 1, wherein the first phosphor emits light in a first color, and the second phosphor emits light in a different, second color.

9. The vehicle keypad assembly of claim 8, wherein the first color is green and the second color is red.

10. The vehicle keypad assembly of claim 1, wherein the virtual button is associated with a capacitance-type sensing device.

11. The vehicle keypad assembly of claim 1, wherein the first phosphor and the second phosphor are disposed on an interior of the transparent panel such that at least some light emitted from the first phosphor, the second phosphor, and the light source passes through the transparent panel and is visible from an exterior of the vehicle.

12. The vehicle keypad assembly of claim 11, further comprising a coating applied to an interior surface of the transparent panel between the first phosphor and the interior surface, but not between the second phosphor and the interior surface.

13. The vehicle keypad assembly of claim 12, wherein the first phosphor is an array of dots applied to the coating, and the second phosphor is an array of dots applied to the interior surface of the transparent panel.

14. The vehicle keypad assembly of claim 11, wherein the transparent panel is a glass panel.

15. A vehicle keypad illumination method, comprising:
   selectively illuminating a first area of a keypad in one of a plurality of different colors while illuminating a different, second area of the keypad in a single color, the keypad associated with a capacitance-type sensing device having a plurality of virtual buttons disposed within a transparent panel of a vehicle.

16. The vehicle keypad illumination method of claim 15, wherein the first area and the second area are areas of a virtual button of the keypad, and further comprising:
   illuminating the second area in a first color and the first area in a second color to indicate an unsuccessful activation of the virtual button, and illuminating the second area in the first color and the first area in a third color to indicate a successful activation of the virtual button.

17. The vehicle keypad illumination method of claim 15, further comprising:

activating a visible light source to illuminate the first and second areas in a first color;

activating an ultraviolet light source to excite a first phosphor that illuminates the first area in a second color, and to excite a second phosphor that illuminates the second area in the first color;

activating both the visible light source and the ultraviolet light source to illuminate the first area in a third color, and to illuminate the second area in the first color.

18. The vehicle keypad illumination method of claim 15, further comprising:

illuminating selected ones of the plurality of virtual buttons to remind a user of a feature that can be initiated by activating the selected ones of the plurality of virtual buttons.

19. The vehicle keypad illumination method of claim 15, further comprising changing an intensity of the illuminating of the second area in the single color when changing the illuminating of the first area from a first one of the plurality of colors to a second one of the plurality of colors.

20. A keypad assembly, comprising:

a window of a vehicle;

a virtual button having a first area and a second area disposed within the window;

a first phosphor between the first area and a light source; and a different, second phosphor between the second area and the light source.

* * * * *